United States Patent
Sekiguchi (10) Patent No.: US 10,388,774 B2
(45) Date of Patent: Aug. 20, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Hideki Sekiguchi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/911,463

(22) Filed: Mar. 5, 2018

(65) Prior Publication Data
US 2019/0172935 A1    Jun. 6, 2019

(30) Foreign Application Priority Data
Dec. 4, 2017    (JP) .................. 2017-232860

(51) Int. Cl.
*H01L 29/739* (2006.01)
*H01L 29/06* (2006.01)
*H01L 29/10* (2006.01)
*H01L 29/423* (2006.01)

(52) U.S. Cl.
CPC ...... *H01L 29/7397* (2013.01); *H01L 29/0696* (2013.01); *H01L 29/1095* (2013.01); *H01L 29/4236* (2013.01)

(58) Field of Classification Search
CPC ................................................ H01L 29/7397
See application file for complete search history.

(56) References Cited

U.S. PATENT DOCUMENTS

| | | | | |
|---|---|---|---|---|
| 6,686,625 B2 * | 2/2004 | Tihanyi | ............... | H01L 29/7813 257/331 |
| 6,781,200 B2 * | 8/2004 | Ishimura | ............. | H01L 29/0696 257/329 |
| 7,285,822 B2 | 10/2007 | Bhalla et al. | | |
| 7,354,829 B2 * | 4/2008 | Aoki | ................ | H01L 21/28194 438/272 |

(Continued)

FOREIGN PATENT DOCUMENTS

| JP | 2012-178389 A | 9/2012 |
|---|---|---|
| JP | 5040240 B2 | 10/2012 |
| JP | 5323359 B2 | 10/2013 |

*Primary Examiner* — William A Harriston
(74) *Attorney, Agent, or Firm* — White & Case LLP (57) ABSTRACT

A semiconductor device includes: a first electrode; a second electrode; a semiconductor region forming region between the first electrode and the second electrode; a first insulating film between the semiconductor region forming region and the second electrode; an actuation gate electrode in the semiconductor region forming region via a second insulating film; a dummy gate electrode, at a distance from the actuation gate electrode, on each of both sides of the actuation gate electrode in the semiconductor region forming region via a third insulating film; a trench contact, in a manner facing the actuation gate electrode, at a position in the third insulating film and between the dummy gate electrode and the semiconductor region forming region; and a contact electrode in the first insulating film and configured to electrically connect the trench contact to the second electrode.

13 Claims, 11 Drawing Sheets

(56) References Cited

U.S. PATENT DOCUMENTS

| | | | |
|---|---|---|---|
| 7,541,642 B2* | 6/2009 | Kawamura | H01L 29/4236 257/331 |
| 7,902,075 B2* | 3/2011 | Grivna | H01L 21/76232 438/702 |
| 7,952,143 B2* | 5/2011 | Soeno | H01L 27/0664 257/133 |
| 8,390,097 B2 | 3/2013 | Hamaguchi et al. | |
| 8,723,254 B2* | 5/2014 | Hikichi | H01L 29/456 257/332 |
| 8,841,175 B2* | 9/2014 | Fujii | H01L 29/66348 257/E21.384 |
| 9,076,765 B2* | 7/2015 | Blank | H01L 29/407 |
| 9,496,352 B2* | 11/2016 | Matsudai | H01L 29/45 |
| 9,536,997 B1* | 1/2017 | Yokoyama | H01L 29/407 |
| 9,570,353 B1* | 2/2017 | Kameyama | H01L 21/78 |
| 2007/0210350 A1* | 9/2007 | Omura | H01L 23/4824 257/287 |
| 2012/0217577 A1 | 8/2012 | Hashimoto et al. | |
| 2013/0221402 A1* | 8/2013 | Ogura | H01L 29/7395 257/139 |

\* cited by examiner

SEMICONDUCTOR DEVICE

CROSS-REFERENCE TO RELATED APPLICATIONS

This application is based upon and claims the benefit of priority from Japanese Patent Application No. 2017-232860, filed on Dec. 4, 2017; the entire contents of which are incorporated herein by reference.

FIELD

Embodiments of the present invention relate to a semiconductor device.

BACKGROUND

A trench contact of an insulated gate bipolar transistor (IGBT) is formed between gate trenches, namely, between gate electrodes aligned at equal intervals. In this structure, a channel width, a trench contact width, a diffusion width of a contact layer, variations thereof, misalignment in lithography, and the like are needed to be considered in order to achieve miniaturization without affecting characteristics of the IGBT. For example, in a case where a mesa width (distance between gate trenches) is miniaturized to a width narrower than about 0.6 μm, an operation characteristic such as a gate characteristic (threshold voltage Vth) of the IGBT may be affected.

DETAILED DESCRIPTION

In the following, a semiconductor device and a manufacturing method for the same according to the present embodiment will be described with reference to the drawings. Note that constituent elements having substantially a same function and a same structure are denoted by a same reference sign in the following description and repetition of the same description will be provided only when necessary.

Meanwhile, the drawings are schematic or conceptual, and a relation between a thicknesses and a width of each portion, a proportion of a size between portions, and the like are not necessarily the same as an actual one. Additionally, even in a case where the same portion is illustrated, a dimension and a proportion may be illustrated differently between the drawings.

In the description of respective embodiments, three-dimensional coordinates (XYZ coordinate system) are introduced in order to indicate directions of the semiconductor device. An X direction and a Y direction are orthogonal to each other in the same plane. Also, a Z direction is orthogonal to the X direction and the Y direction.

Furthermore, in the following description, notations of $n^+$, n, $n^-$, $p^+$, and p represent relative levels of impurity concentrations in respective conductivity types. More specifically, the notation added with "+" indicates an impurity concentration relatively higher than the notation without any of "+" or "−", and the notation added with "−" indicates an impurity concentration relatively lower than the notation without any thereof. Additionally, in the respective embodiments described below, the respective embodiments may also be implemented by inverting an n type (second conductivity type) and a p type (first conductivity type) in each semiconductor region.

First Embodiment

A semiconductor device according to a first embodiment is provided to miniaturize the semiconductor device while keeping a distance between a trench contact and an actuation gate electrode by forming the trench contact in a portion of a gate insulating film of a dummy gate electrode arranged on each of both sides of the actuation gate electrode. In the following, the details thereof will be described.

Figure 1:
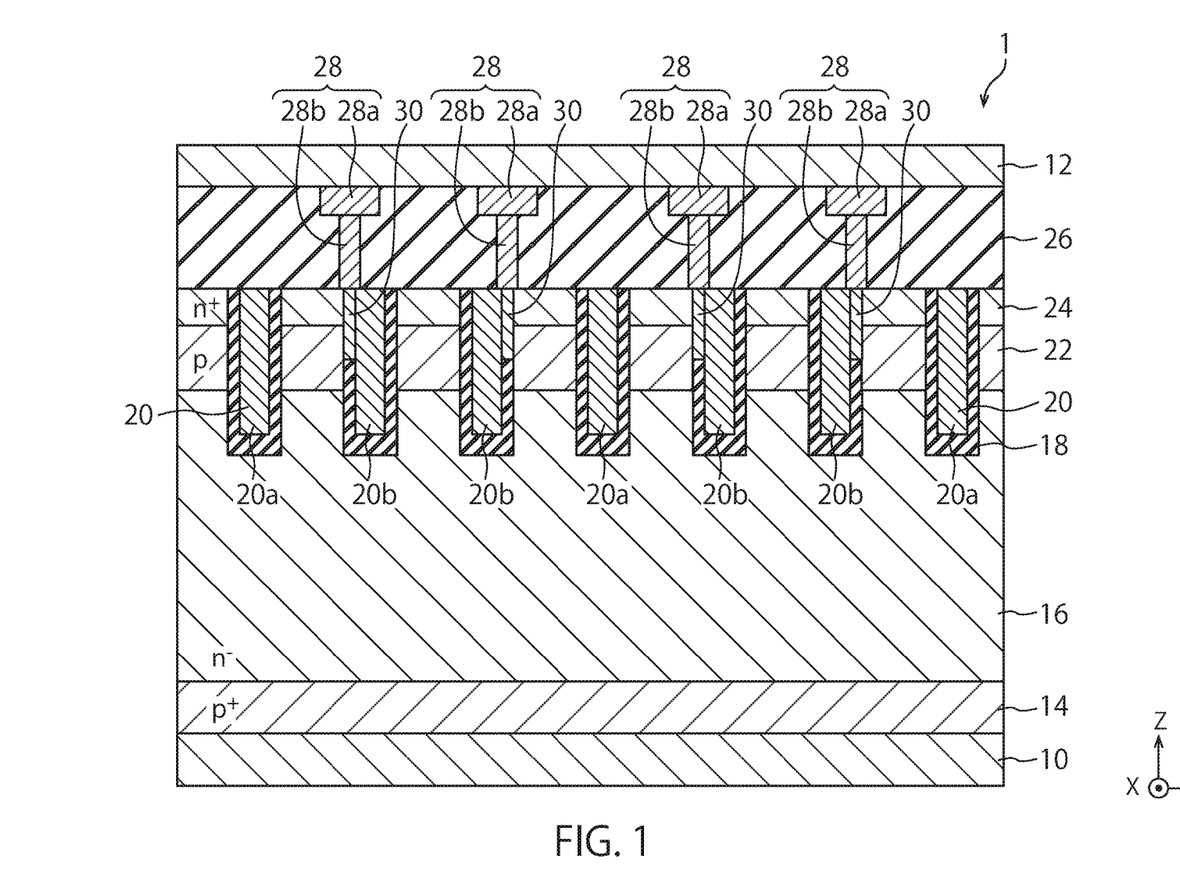
FIG. 1 is a cross-sectional view illustrating a structure of a semiconductor device according to a first embodiment.

FIG. 1 is a cross-sectional view of a semiconductor device to describe a structure of the semiconductor device 1 according to the present embodiment. As illustrated in FIG. 1, the semiconductor device 1 according to the present embodiment constitutes an IGBT including a plurality of actuation gate electrodes and a plurality of dummy gate electrodes.

As illustrated in FIG. 1, the semiconductor device 1 includes a collector electrode 10, an emitter electrode 12, a $p^+$ type collector region 14, an $n^-$ type drift region 16, a gate insulating film 18, a gate electrode 20, a p type base region 22, an $n^+$ type emitter region 24, a contact insulating film 26, a contact electrode 28, and a trench contact 30.

The semiconductor device 1 has a vertical electrode structure in which various kinds of semiconductor regions and the like are formed between the collector electrode 10 and the emitter electrode 12. In the present embodiment, a direction from the collector electrode 10 to the emitter electrode 12 corresponds to an upper side in the Z direction, and an opposite direction thereto corresponds to a lower side in the Z direction.

In the semiconductor device 1, the collector region 14, drift region 16, base region 22, emitter region 24, and contact insulating film 26 are provided in the Z direction between the collector electrode 10 and the emitter electrode 12. The collector region 14 is electrically connected to the collector electrode 10. The drift region 16 is located between the emitter electrode 12 and the collector region 14, particularly, between the collector region 14 and the base region 22.

In the Z direction, the base region 22 is provided between the drift region 16 and the emitter electrode 12, and the emitter region 24 is provided between the base region 22 and the emitter electrode 12. The base region 22 is located above the drift region 16 in the Z direction, and the emitter region 24 is located above the base region 22 in the Z direction.

The gate electrode 20 is formed in the drift region 16, base region 22, and emitter region 24 via the gate insulating film 18. The gate insulating film 18 and the gate electrode 20 extend in the X direction. Additionally, a plurality of gate insulating films 18 and a plurality of gate electrodes 20 are arranged at a predetermined distance in the Y direction.

In the present embodiment, some of the gate electrodes 20 illustrated in FIG. 1 function as actuation gate electrodes 20a to actuate the IGBT, and other remaining gate electrodes 20 function as dummy gate electrodes 20b that do not affect actuation. In the present embodiment, the dummy gate electrodes 20b are arranged on both sides of an actuation gate electrode 20a at a predetermined distance from the actuation gate electrode 20a.

A trench contact 30 is formed in a gate insulating film 18 provided between a dummy gate electrode 20b, and the drift region 16, the base region 22 and the emitter region 24. More specifically, an upper portion of a gate insulating film 18 of a dummy gate electrode 20b formed on an actuation gate electrode 20a side is replaced by a trench contact 30. In other words, a trench contact 30 is formed, in a manner facing an actuation gate electrode 20a, at a position included in a gate insulating film 18 and located between a dummy gate electrode 20b, and the base region 22 and the emitter region 24.

The trench contact 30 contacts the base region 22 and the emitter region 24 in the Y direction on an actuation gate electrode 20a side, contacts a contact electrode 28 in the Z direction on the contact electrode 28 side, and contacts a dummy gate electrode 20b in the Y direction on the dummy gate electrode 20b side. In the present embodiment, the trench contact 30 is formed of a metal silicide obtained by silicidation of a metal such as nickel (Ni), cobalt (Co), or titanium (Ti).

In the present embodiment, one dummy gate electrode 20b is provided in each of both sides of one actuation gate electrode 20a, in total, two dummy gate electrodes 20b are provided for one actuation gate electrode 20a, but the number of dummy gate electrodes 20b to be provided for one actuation gate electrode 20a is not limited thereto. For example, an arbitrary number of dummy gate electrodes 20b, for example, two or three thereof may be provided in each of both sides of one actuation gate electrode 20a. In other words, in the semiconductor device 1 according to the present embodiment, it can be expressed that at least one dummy gate electrode 20b is provided in each of both sides of one actuation gate electrode 20a at a distance from the actuation gate electrode 20a.

The contact insulating film 26 is provided between the emitter electrode 12 and the emitter region 24 in the Z direction. In the contact insulating film 26, a contact electrode 28 to electrically connect the emitter electrode 12 to each trench contact 30 is formed. In a cross-section in the Z direction, a contact electrode 28 is formed in a T shape, and includes a head portion 28a and a leg portion 28b. An upper surface in the Z direction of the head portion 28a is electrically connected to the emitter electrode 12, and a lower end portion in the Z direction of the leg portion 28b is electrically connected to each trench contact 30. The head portion 28a and the leg portion 28b of each contact electrode 28 include a barrier metal layer and a metal-embedded layer, respectively.

Next, operation of the semiconductor device 1 will be described. In the semiconductor device 1 according to the present embodiment, a voltage higher than a voltage applied to the emitter electrode 12 is applied to the collector electrode 10. In a case where a voltage of a threshold voltage (Vth) or higher is supplied to each actuation gate electrode 20a in this state, the semiconductor device 1 is turned to an ON state.

In other words, an n type channel region is formed on a surface of the base region 22 along each gate insulating films 18 of each actuation gate electrodes 20a. Consequently, electrons flow from the emitter region 24 to the base region 22, drift region 16, and collector region 14 in this order. With this electron flow, as shown in an enlarged view of the vicinity of each actuation gate electrode 20a illustrated in FIG. 2, holes H flow sequentially from the collector region 14 to the drift region 16, base region 22, trench contacts 30, and contact electrodes 28.

Figure 2:
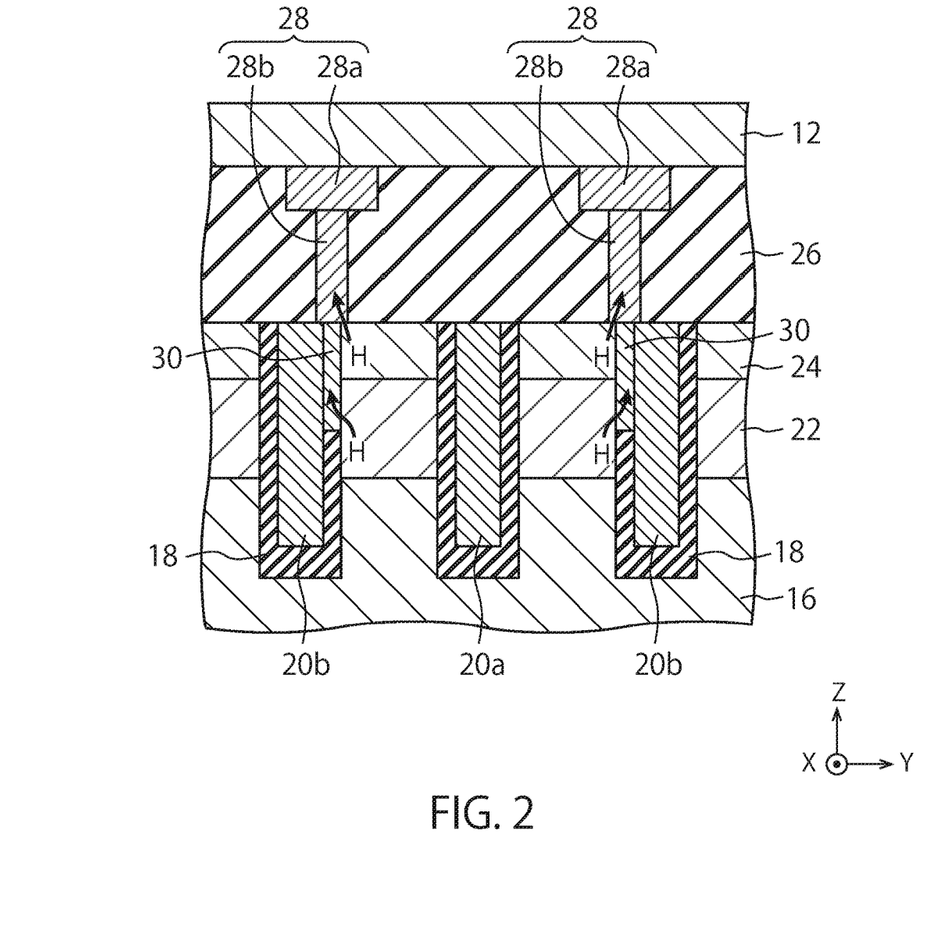
FIG. 2 is a partly-enlarged cross-sectional view of the semiconductor device illustrated in FIG. 1.

In a case where the voltage applied to each actuation gate electrode 20a is lower than the threshold voltage (Vth), the semiconductor device 1 is shifted from the ON state to an OFF state. Additionally, a width in the Y direction of the leg portion 28b in each contact electrode 28 is formed larger than a width in the Y direction of each trench contact 30. Therefore, a part of the lower end portion of the leg portion 28b in each contact electrode 28 contacts the emitter region 24. Therefore, when the semiconductor device 1 is shifted from the ON state to the OFF state, the holes H flow into each contact electrode 28 not only from a trench contacts 30 but also from the lower end of the leg portion 28b thereof. As a result, the semiconductor device 1 can be quickly switched from the ON state to the OFF state.

Figure 3:
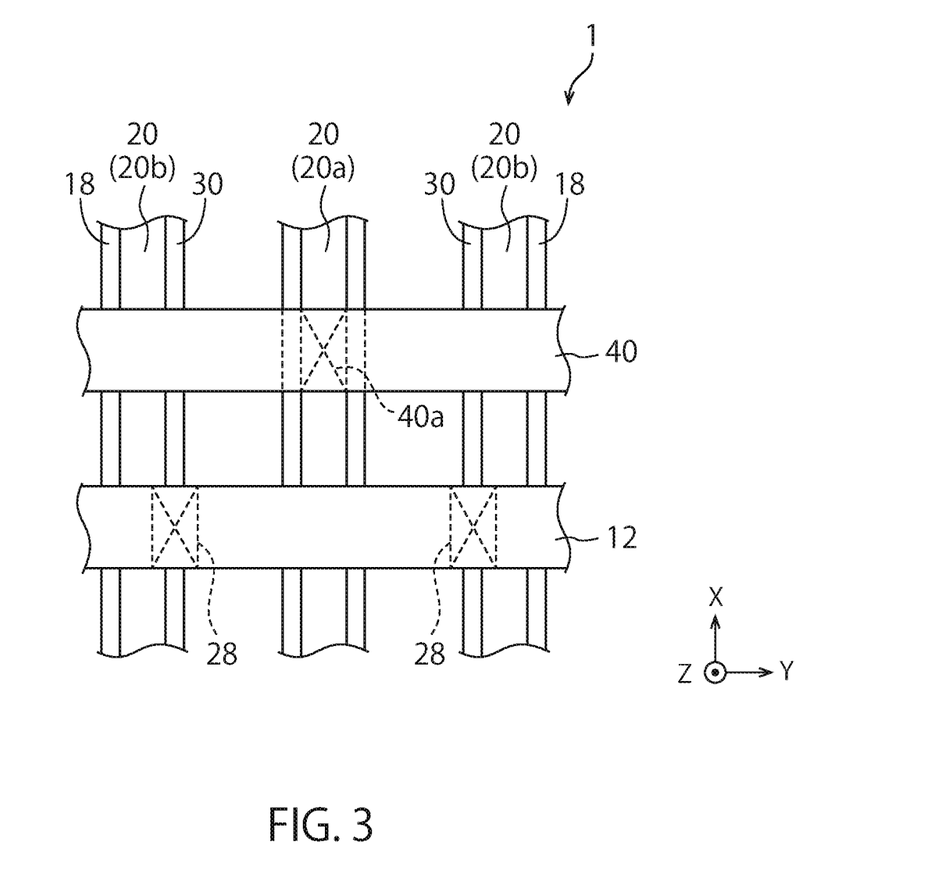
FIG. 3 is a plan view illustrating a wiring layout of the semiconductor device according to the first embodiment.

FIG. 3 is a diagram illustrating an exemplary wiring layout of the semiconductor device 1 according to the present embodiment. As illustrated in FIG. 3, each of the actuation gate electrodes 20a, dummy gate electrodes 20b, gate insulating films 18, and trench contacts 30 are formed along the X direction, and a gate wiring 40 and the emitter electrode 12 are formed in the Y direction.

A contact 40a extending in the Z direction is formed at an intersection between one actuation gate electrode 20a and the gate wiring 40, and the actuation gate electrode 20a and the gate wiring 40 are electrically connected. For example, a gate drive signal is input in the gate wiring 40, and the ON state and the OFF state of the semiconductor device 1 are controlled.

Additionally, each contact electrode 28 extending in the Z direction is formed at an intersection between each trench contact 30 and the emitter electrode 12, and each trench contact 30 and the emitter electrode 12 are electrically connected. The emitter electrode 12 is connected to the ground, for example, and holes from the base region 22 and the emitter region 24 flow into the emitter electrode 12.

As it can be grasped from the above description, the collector electrode 10 corresponds to a first electrode in the present embodiment, and the emitter electrode 12 corresponds to a second electrode in the present embodiment. Additionally, a semiconductor region forming region according to the present embodiment includes the collector region 14, drift region 16, base region 22, and emitter region 24. Furthermore, the contact insulating film 26 corresponds to a first insulating film according to the present embodiment, each gate insulating film formed around each actuation gate electrode 20a corresponds to a second insulating film, and each gate insulating film 18 formed around each dummy gate electrode 20b corresponds to a third insulating film. Additionally, the Y direction corresponds to a first direction in the present embodiment.

Furthermore, the $p^+$ type collector region 14 corresponds to a first semiconductor region of a first conductivity type according to present embodiment, the $n^-$ type drift region 16 corresponds to a second semiconductor region of a second conductivity type according to present embodiment, the p type base region 22 corresponds to a third semiconductor region of the first conductivity type in the present embodiment, and the $n^+$ type emitter region 24 corresponds to a fourth semiconductor region of the second conductivity type in present embodiment.

Next, a manufacturing method for the semiconductor device 1 according to the present embodiment will be described. FIGS. 4 to 7 are cross-sectional views illustrating manufacturing processes for the semiconductor device 1 according to the present embodiment.

Figure 4:
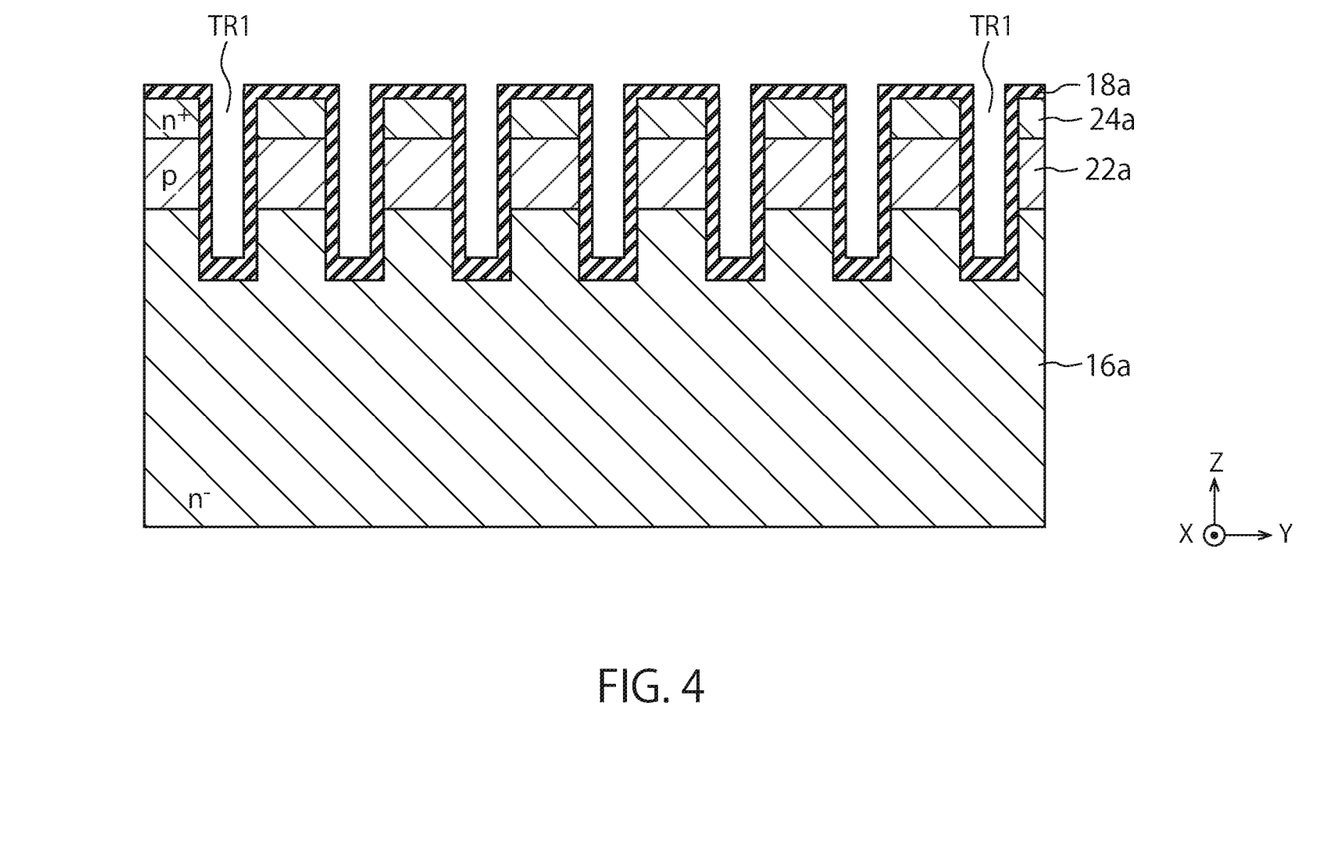
FIG. 4 is a cross-sectional view illustrating a manufacturing process for the semiconductor device according to the first embodiment.

First, as illustrated in FIG. 4, an $n^-$ type semiconductor substrate 16a is prepared. Subsequently, p type impurities are ion-implanted into an upper surface side in the Z direction of the $n^-$ type semiconductor substrate 16a to form a p type semiconductor region 22a. Additionally, n type impurities are ion-implanted into an upper surface side in the Z direction of the p type semiconductor region 22a to form an $n^+$ type semiconductor region 24a.

Subsequently, a plurality of trenches TR1 reaching the $n^-$ type semiconductor substrate 16a is formed in a manner penetrating the p type semiconductor region 22a and the $n^+$ type semiconductor region 24a. The p type semiconductor region 22a and $n^+$ type semiconductor region 24a are divided by the plurality of trenches TR1 into a plurality of portions in the Y direction. Consequently, the p type semiconductor region 22a becomes the above-described base region 22, and the $n^+$ type semiconductor region 24a becomes the above-described emitter region 24. Subsequently, an insulating film 18a is formed on an inner wall of each trench TR1 and a surface in the Z direction of the p type semiconductor region 22a by thermal oxidation, for example.

Figure 5:
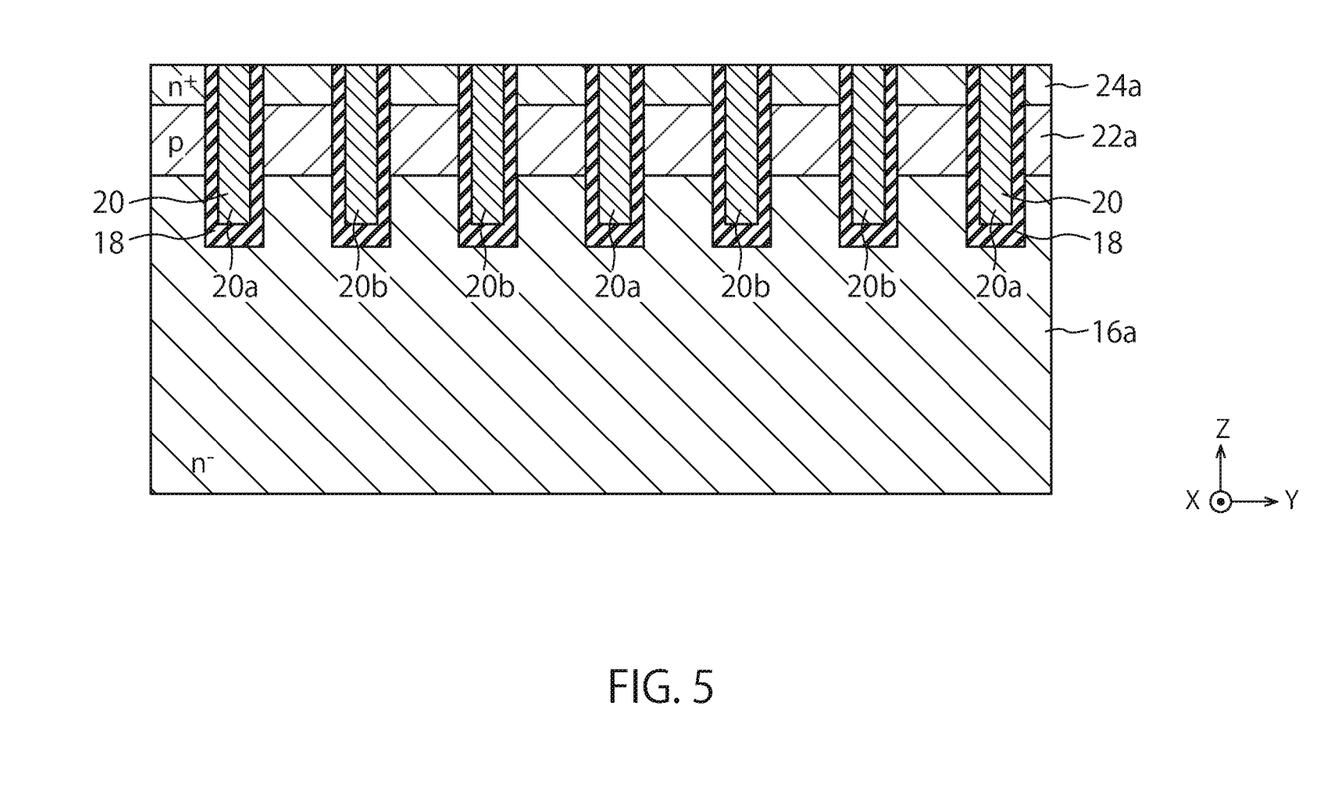
FIG. 5 is a cross-sectional view illustrating a manufacturing process for the semiconductor device according to the first embodiment.

Next, as illustrated in FIG. 5, a conductive film is formed on the insulating film 18a, and each conductive film is etched back to form a gate electrode 20 in each trenches TR1. As described above, some of a plurality of gate electrodes 20 functions as the actuation gate electrode 20a and other remaining gate electrodes 20 function as the dummy gate electrodes 20b. Additionally, the above-described gate insulating film 18 is formed from the insulating film 18a remaining on the inner wall of each trench TR1.

Figure 6:
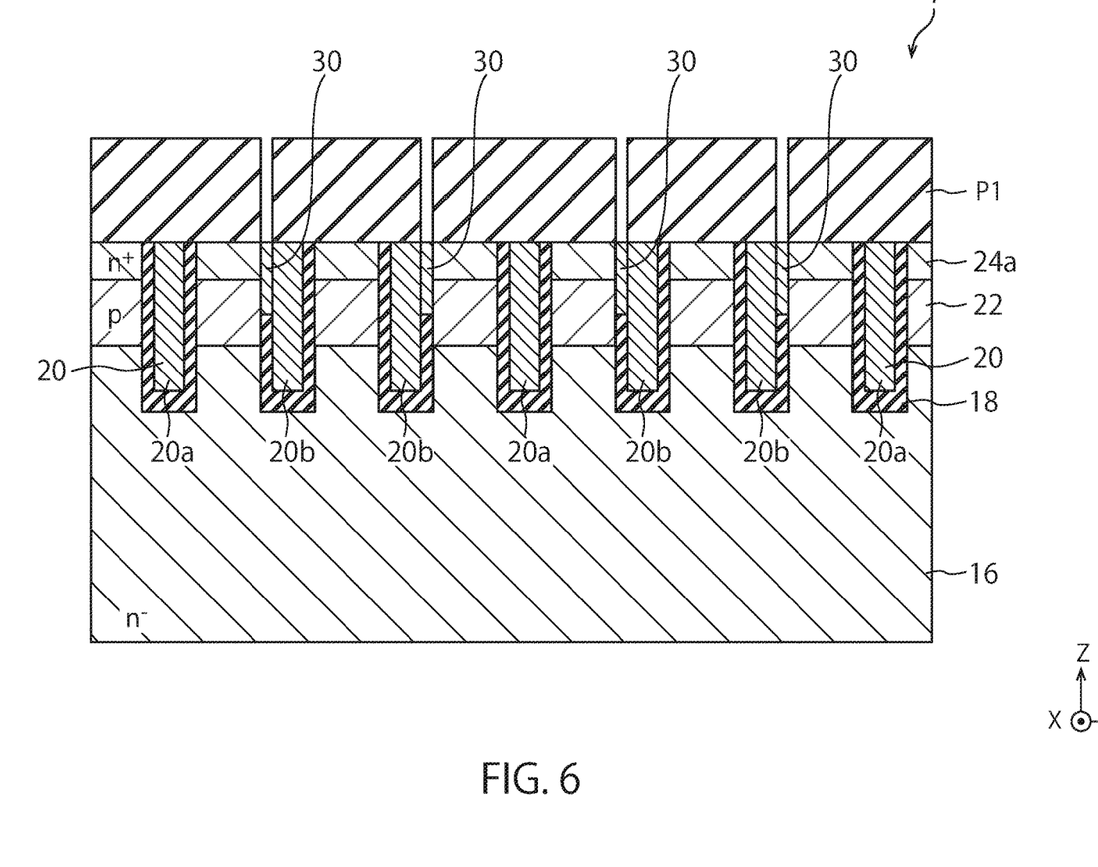
FIG. 6 is a cross-sectional view illustrating a manufacturing process for the semiconductor device according to the first embodiment.

Next, as illustrated in FIG. 6, photoresist is applied and patterned to form a resist P1 having an opening at a position in which an above-described trench contact 30 is to be formed. A gate insulating film 18 is exposed from each opening of the resist P1. Subsequently, the gate insulating film 18 exposed from each openings of the resist P1 is partly removed by, for example, reactive ion etching (RIE). In the present embodiment, for example, the gate insulating film 18 is removed in a depth of 0.5 μm from a surface of the $n^+$ type semiconductor region 24a.

Subsequently, a trench contact 30 is formed in a portion from where the gate insulating films 18 has been removed. In present embodiment, for example, a metal such as nickel (Ni), cobalt (Co), or titanium (Ti) is embedded, by sputtering, in a portion from where an insulating film 18a has been removed, and each trench contact 30 is formed from a metal silicide obtained by silicidation through silicide processing.

Figure 7:
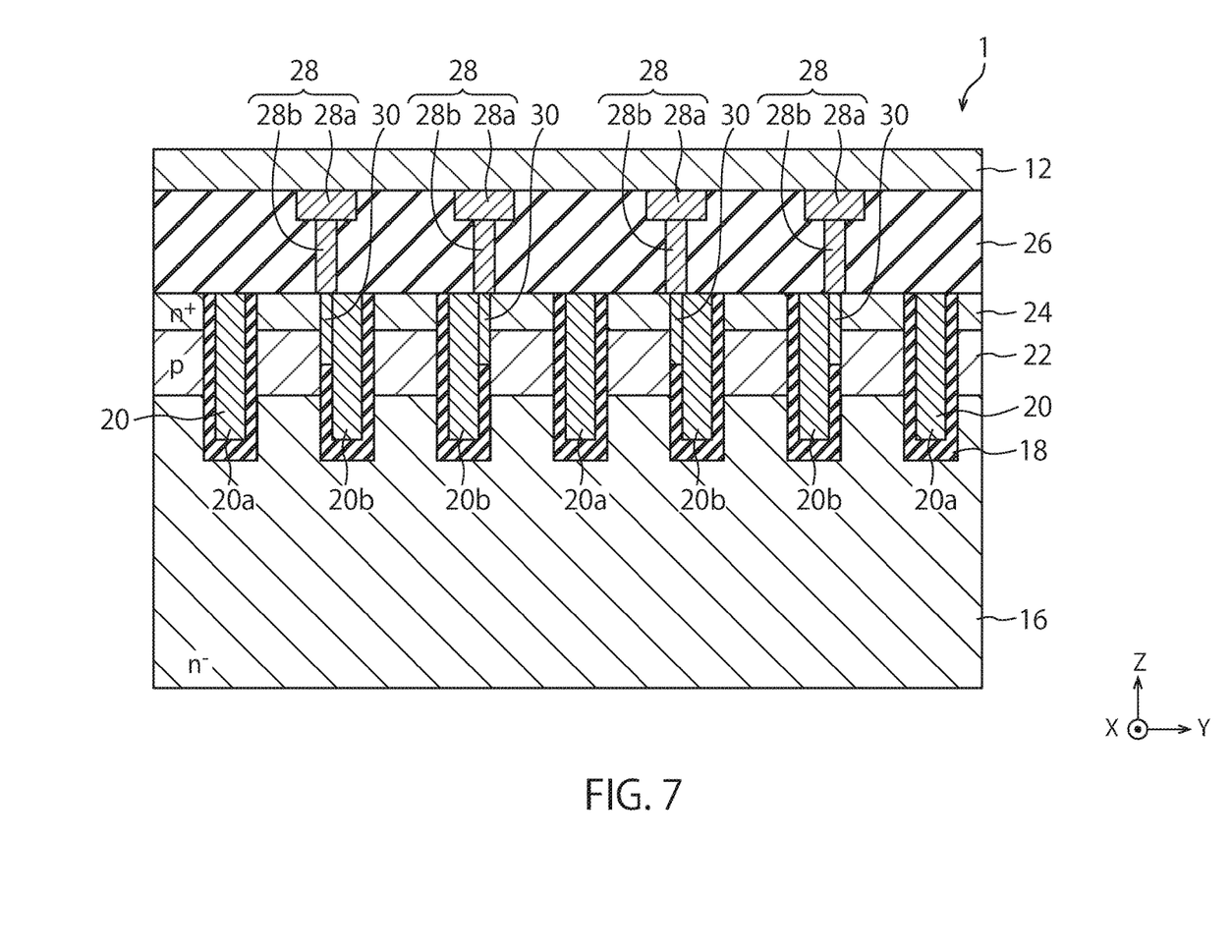
FIG. 7 is a cross-sectional view illustrating a manufacturing process for the semiconductor device according to the first embodiment.

Next, as illustrated in FIG. 7, the resist P1 is peeled off, a contact insulating film 26 is formed, and the contact insulating film 26 is selectively etched, thereby forming an opening at a position included in the contact insulating film 26 and located above each trench contact 30. Subsequently, a contact electrode 28 connected to each trench contacts 30 is formed in a manner embedded in the opening. In the present embodiment, each contact electrode 28 is formed from, for example: a barrier metal layer including titanium (Ti) and titanium nitride (TIN); and a metal-embedded layer including tungsten (W). Here, for example, titanium (Ti) has a thickness of 5 nm to 10 nm, titanium nitride (TIN) has a thickness of 5 nm to 10 nm, and tungsten (W) has a thickness of 200 nm to 500 nm. Subsequently, the emitter electrode 12 is formed on an upper surface in the Z direction of the contact insulating film 26 and the contact electrodes 28.

As described above, since a width in the Y direction of a leg portion 28b in each contact electrode 28 is formed larger than a width in the Y direction of each trench contact 30, a relatively large margin can be secured in accuracy between aligning the photoresist at the time of forming each trench contact 30 and aligning the photoresist at the time of forming each contact electrode 28.

Next, as it can be grasped from FIG. 1, a lower surface side in the Z direction of the semiconductor substrate 16a is polished until the semiconductor substrate 16a comes to have a predetermined thickness. The drift region 16 is formed from the polished semiconductor substrate 16a. Subsequently, p type impurities are ion-implanted to form the $p^+$ type collector region 14. Subsequently, the collector electrode 10 is formed on a lower surface in the Z direction of the $p^+$ type collector region 14. Thus, the semiconductor device 1 illustrated in FIG. 1 is obtained.

Figure 8:
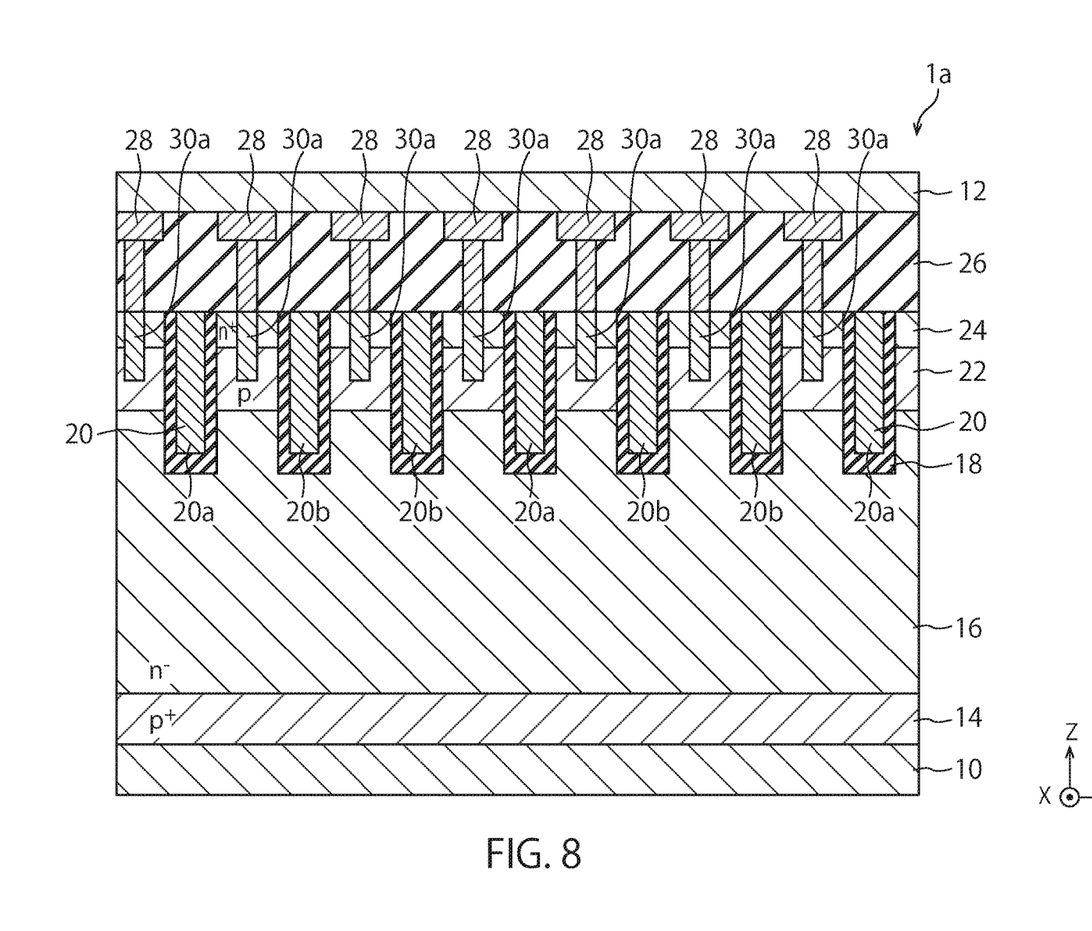
FIG. 8 is a cross-sectional view illustrating a structure of a semiconductor device according to a comparative example.

As described above, according to the semiconductor device 1 of the present embodiment, a trench contacts 30 is formed at a position from where a gate insulating film 18 located at a position facing an actuation gate electrode 20a is partly removed, and therefore, a distance between an actuation gate electrode 20a and a trench contact 30 can be separated as much as possible. In other words, compared to a case where a trench contact 30a is formed in a base region 22 and an emitter region 24 which are located between an actuation gate electrode 20a and a dummy gate electrode 20b as illustrated in a semiconductor device 1a according to a comparative example in FIG. 8, a distance between an actuation gate electrode 20a and a trench contact 30 can be secured larger. Therefore, to miniaturize the semiconductor device 1, it is possible to prevent an actuation gate electrode 20a and a trench contact 30 from coming close to each other and adversely affecting the threshold voltage (Vth) and the gate characteristics.

Second Embodiment

In a semiconductor device 1 according to a first embodiment, one contact electrode 28 is formed for one trench contact 30, but in a semiconductor device 1 according to a second embodiment, a width of an opening in a photoresist at the time of forming a trench contact can be formed large by forming one contact electrode for a plurality of trench contacts. In the following, points different from the above-described first embodiment will be described.

Figure 9:
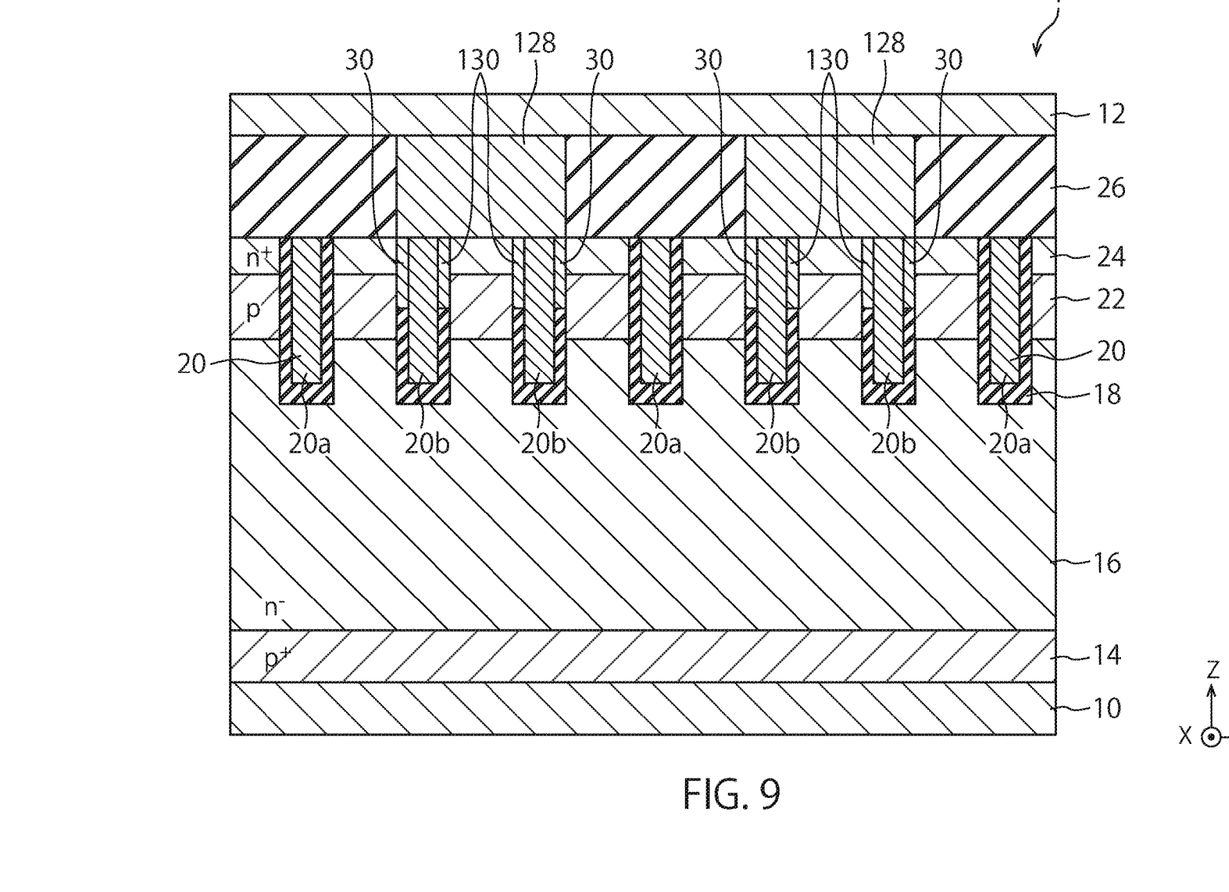
FIG. 9 is a cross-sectional view illustrating a structure of a semiconductor device according to a second embodiment.

FIG. 9 is a cross-sectional view of the semiconductor device 1 to describe a structure of the semiconductor device 1 according to the present embodiment, and it is the view corresponding to FIG. 1 in the above-described first embodiment.

As illustrated in FIG. 9, in the semiconductor device 1 according to the present embodiment, a trench contact 130 is also formed in addition to a trench contact 30 in a manner facing an actuation gate electrode 20a at a position of a gate insulating film 18 located between a dummy gate electrode 20b, and the base region 22 and the emitter region 24. The trench contact 130 is at a position of a gate insulating film 18 in a manner facing a trench contact 30 via a dummy gate electrode 20b and located between the dummy gate electrode 20b, and a base region 22 and an emitter region 24. In other words, one dummy gate electrode 20b is provided with a pair of the trench contacts 30 and 130.

Furthermore, in the semiconductor device 1 according to the present embodiment, a contact electrode 128 formed in a contact insulating film 26 is formed in a manner stretching over the plurality of trench contacts 30 and 130. In the example of FIG. 9, one contact electrode 128 is formed in common for two dummy gate electrodes 20b and 20b. Therefore, one contact electrode 128 is electrically connected to the four trench contacts 30, 130, 130 and 30, and the four trench contacts 30, 130, 130, and 30 are connected to an emitter electrode 12 by one contact electrode 128.

In other words, each contact electrode 128 is formed so as to connect, in common, trench contacts 30 and 130 of a plurality of dummy gate electrodes 20b and 20b formed between an actuation gate electrode 20a and an actuation gate electrode 20a. Therefore, as described in the above first embodiment, in a case of providing, for example, two or three dummy gate electrodes 20b on each of both sides of one actuation gate electrode 20a, eight trenches contacts 30 and 130 (four dummy gate electrodes 20b) and twelve trench contacts 30 and 130 (six dummy gate electrodes 20b) are formed, and these trench contacts are connected in common to the emitter electrode 12 by one contact electrode 128.

Meanwhile, operation of the semiconductor device 1 according to the present embodiment is similar to operation of the semiconductor device 1 according to the above-described first embodiment. Additionally, each trench contact 130 corresponds to an additional trench contact according to present embodiment.

Figure 10:
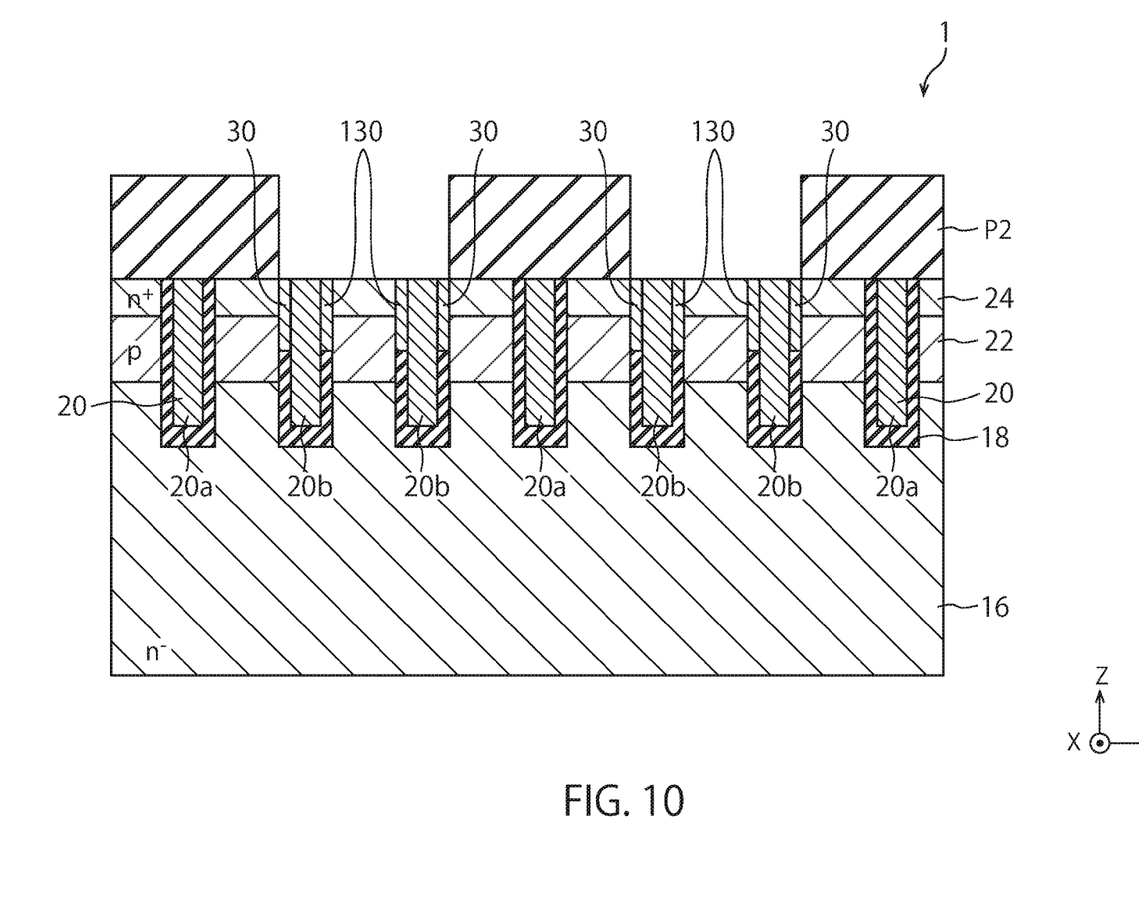
FIG. 10 is a cross-sectional view illustrating a manufacturing process for the semiconductor device according to the second embodiment.
Figure 11:
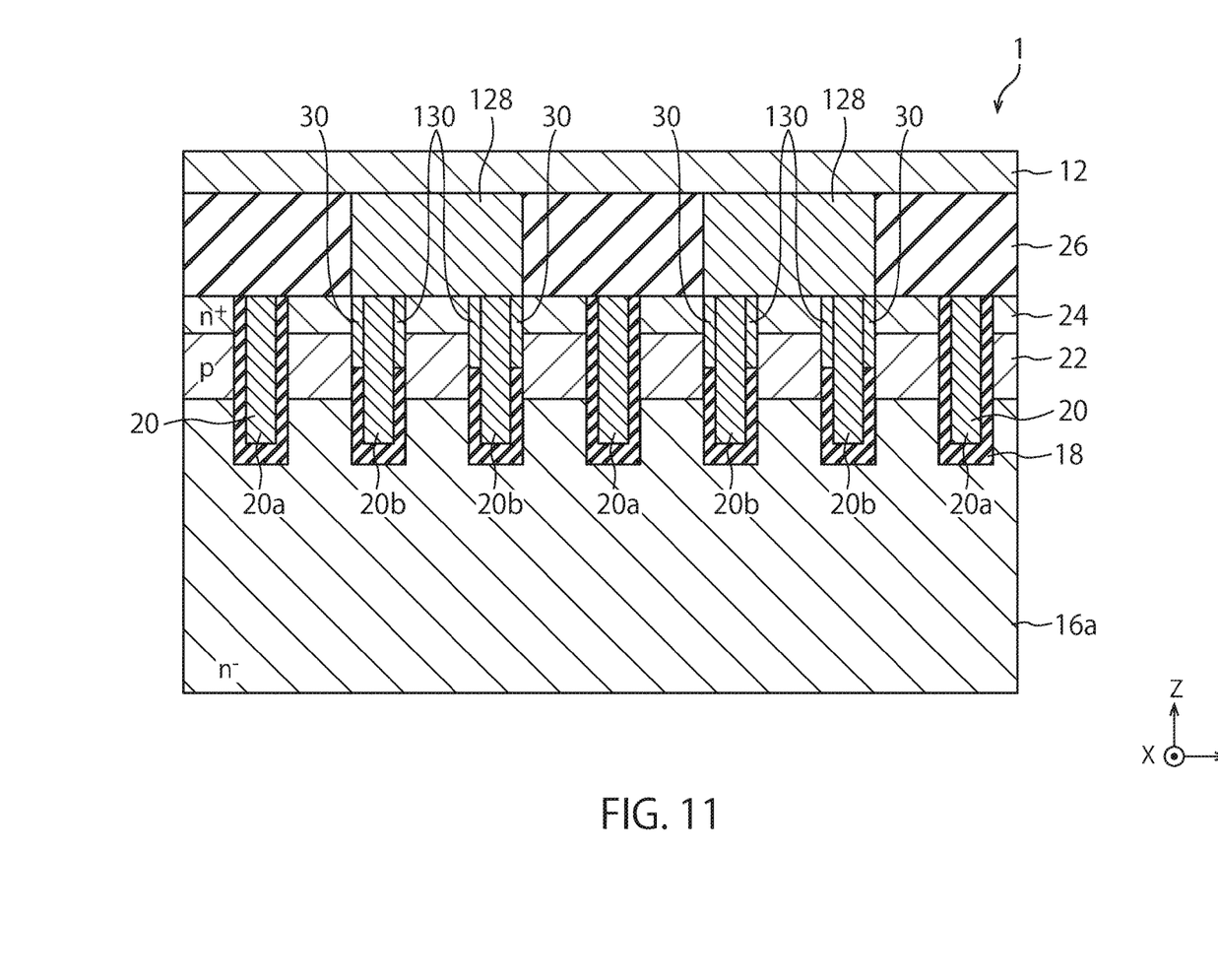
FIG. 11 is a cross-sectional view illustrating a manufacturing process for the semiconductor device according to the second embodiment.

Next, a manufacturing method for the semiconductor device 1 according to the present embodiment will be described. FIGS. 10 to 11 are cross-sectional views illustrating manufacturing processes for the semiconductor device 1 according to the present embodiment.

The manufacturing processes up to FIG. 4 and FIG. 5 are similar to those described in the first embodiment. As illustrated in FIG. 10 continuous from FIG. 5, a resist P2 having an opening at a position where each contact electrode 128 described above is to be formed is formed by applying photoresist and performing patterning. Two dummy gate electrodes 20b and two gate insulating films 18 formed around these two dummy gate electrodes 20b are exposed from such an opening of the resist P2. Subsequently, the gate insulating films 18 exposed from the opening of the resist P2 is partly removed by, for example, reactive ion etching (RIE). In the present embodiment, for example, each gate insulating film 18 is removed in a depth of 0.5 μm from a surface of an n+ type semiconductor region 24a.

Subsequently, trench contacts 30 and 130 are formed in portions from where such gate insulating films 18 have been removed. In the present embodiment, for example, a metal such as nickel (Ni), cobalt (Co), or titanium (Ti) is embedded, by sputtering, in the portions from where the insulating films 18a have been removed, and trench contacts 30 and 130 are formed from a metal silicide obtained by silicidation through silicide processing.

Next, as illustrated in FIG. 11, the resist P2 is peeled off, a contact insulating film 26 is formed, and this contact insulating film 26 is selectively etched to form an opening including two dummy gate electrodes 20b and 20b. Subsequently, a contact electrode 128 connected to trench contacts 30 and 130 is formed in a manner embedded in the opening. In the present embodiment, each contact electrode 128 is formed from, for example: a barrier metal layer including titanium (Ti) and titanium nitride (TiN); and a metal-embedded layer including tungsten (W). Here, for example, titanium (Ti) has a thickness of 5 nm to 10 nm, titanium nitride (TiN) has a thickness of 5 nm to 10 nm, and tungsten (W) has a thickness of 200 nm to 500 nm. Subsequently, an emitter electrode 12 is formed on an upper surface in the Z direction of the contact insulating film 26 and the contact electrodes 128.

Next, as it can be grasped from FIG. 9, a lower surface side in the Z direction of a semiconductor substrate 16a is polished until the semiconductor substrate 16a comes to have a predetermined thickness. A drift region 16 is formed from the polished semiconductor substrate 16a. Subsequently, p type impurities are ion-implanted to form a p+ type collector region 14. Subsequently, a collector electrode 10 is formed on a lower surface in the Z direction of the p+ type collector region 14. Thus, the semiconductor device 1 illustrated in FIG. 9 is obtained.

As described above, according to the semiconductor device 1 of the present embodiment also, a trench contact 30 is formed at a position from which a gate insulating film 18 located at a position facing each actuation gate electrode 20a has been partly removed, and therefore, a distance between an actuation gate electrode 20a and a trench contact 30 can be separated as much as possible. Therefore, to miniaturize the semiconductor device 1, it is possible to prevent an actuation gate electrode 20a and a trench contact 30 from coming close to each other and adversely affecting a threshold voltage (Vth) and gate characteristics.

Furthermore, since ah contact electrode 128 is formed in a manner stretching over a plurality of dummy gate electrodes 20b, a width of an opening in the resist P2 can be made large, and a width of the contact electrode 128 can also be made large. Therefore, the semiconductor device 1 according to the present embodiment can be manufactured by utilizing an exposure device in the related art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:
1. A semiconductor device, comprising:
a first electrode;
a second electrode;
a semiconductor region forming region between the first electrode and the second electrode;
a first insulating film between the semiconductor region forming region and the second electrode;

an actuation gate electrode in the semiconductor region forming region via a second insulating film;
a dummy gate electrode, at a distance from the actuation gate electrode, on each of both sides of the actuation gate electrode in the semiconductor region forming region via a third insulating film;
a trench contact, in a manner facing the actuation gate electrode, at a position in the third insulating film and between the dummy gate electrode and the semiconductor region forming region; and
a contact electrode in the first insulating film and configured to electrically connect the trench contact to the second electrode.

2. The semiconductor device according to claim 1, wherein a width of the contact electrode, in which the contact electrode contacts the trench contact in a first direction, is larger than a width in the first direction of the trench contact, and the first direction is a direction in which the actuation gate electrode and the dummy gate electrode are aligned.

3. The semiconductor device according to claim 2, wherein a width in the first direction of the trench contact is substantially equal to a width in the first direction of the third insulating film.

4. The semiconductor device according to claim 1, wherein one pair of the dummy gate electrodes is provided on both sides of the actuation gate electrode at a distance from the actuation gate electrode.

5. The semiconductor device according to claim 1, wherein the trench contact is formed of a metal silicide.

6. The semiconductor device according to claim 1, wherein the contact electrode comprises a barrier metal layer and a metal-embedded layer.

7. The semiconductor device according to claim 1, wherein
the semiconductor region forming region comprises:
a first semiconductor region of a first conductivity type between the first electrode and the first insulating film;
a second semiconductor region of a second conductivity type between the first semiconductor region and the first insulating film;
a third semiconductor region of the first conductivity type between the second semiconductor region and the first insulating film; and
a fourth semiconductor region of the second conductivity type between the third semiconductor region and the first insulating film.

8. The semiconductor device according to claim 1, wherein one contact electrode is provided for a plurality of trench contacts.

9. The semiconductor device according to claim 8, further comprising an additional trench contact at a position in the third insulating film and located between the dummy gate electrode and the semiconductor region forming region in a manner facing the trench contact while interposing the dummy gate electrode between the additional trench contact and the trench contact.

10. The semiconductor device according to claim 8, wherein one pair of dummy gate electrodes is provided on both sides of the actuation gate electrode at a distance from the actuation gate electrode.

11. The semiconductor device according to claim 8, wherein the trench contact is formed of a metal silicide.

12. The semiconductor device according to claim 8, wherein the contact electrode comprises a barrier metal layer and a metal-embedded layer.

13. The semiconductor device according to claim 8 wherein
the semiconductor region forming region includes:
a first semiconductor region of a first conductivity type between the first electrode and the first insulating film;
a second semiconductor region of a second conductivity type between the first semiconductor region and the first insulating film;
a third semiconductor region of the first conductivity type between the second semiconductor region and the first insulating film; and
a fourth semiconductor region of the second conductivity type between the third semiconductor region and the first insulating film.

* * * * *